United States Patent
Cho et al.

(10) Patent No.: US 7,256,076 B2
(45) Date of Patent: Aug. 14, 2007

(54) MANUFACTURING METHOD OF LIQUID CRYSTAL DISPLAY DEVICE

(75) Inventors: Heung-Lyul Cho, Gyeonggi-Do (KR); Soon-Sung Yoo, Gyeonggi-Do (KR); Youn-Gyoung Chang, Gyeonggi-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 309 days.

(21) Appl. No.: 10/814,186

(22) Filed: Apr. 1, 2004

(65) Prior Publication Data

US 2004/0197966 A1 Oct. 7, 2004

(30) Foreign Application Priority Data

Apr. 3, 2003 (KR) .................. 10-2003-0021139

(51) Int. Cl.
*H01L 21/00* (2006.01)
(52) U.S. Cl. .............. 438/151; 438/30; 438/745; 257/59; 257/72; 349/43; 349/139
(58) Field of Classification Search ............ 438/151; 257/72
See application file for complete search history.

(56) References Cited

U.S. PATENT DOCUMENTS

| | | | | |
|---|---|---|---|---|
| 3,994,793 A | * | 11/1976 | Harvilchuck et al. | 204/192.25 |
| 5,550,071 A | * | 8/1996 | Ryou | 438/305 |
| 6,004,874 A | * | 12/1999 | Cleeves | 438/622 |
| 6,274,400 B1 | * | 8/2001 | Jen | 438/30 |
| 6,545,293 B2 | * | 4/2003 | Wong | 257/59 |
| 2004/0125327 A1 | * | 7/2004 | Choi et al. | 349/187 |
| 2004/0129943 A1 | * | 7/2004 | Yoo et al. | 257/72 |
| 2004/0233361 A1 | * | 11/2004 | Ha et al. | 349/114 |

\* cited by examiner

*Primary Examiner*—Carl Whitehead, Jr.
*Assistant Examiner*—Colleen E. Rodgers
(74) *Attorney, Agent, or Firm*—Birch, Stewart, Kolasch & Birch, LLP

(57) ABSTRACT

A manufacturing method of a thin film transistor of a liquid crystal display device using 3-mask includes forming a gate electrode over a substrate, consecutively forming a gate insulating layer and an active layer, forming a first photoresist pattern, removing an active layer formed at a source/drain region, ashing the first photoresist pattern to expose a part of an active region, forming a source/drain electrode, forming a passivation layer, forming a second photoresist pattern that exposes a pixel region over the passivation layer; forming a pixel region by using the second photoresist pattern as a mask, side-etching a part of the passivation layer to expose a part of the drain electrode, forming a pixel electrode material over the second photoresist pattern and the pixel region, and simultaneously removing the second photoresist pattern and the pixel electrode material formed thereon to form a pixel electrode.

16 Claims, 7 Drawing Sheets

CHANNEL REGION | STORAGE REGION | GATE PAD PORTION | DATA PAD PORTION

FIG. 2A
RELATED ART

CHANNEL REGION | STORAGE REGION | GATE PAD PORTION | DATA PAD PORTION

FIG. 2B
RELATED ART

CHANNEL REGION | STORAGE REGION | GATE PAD PORTION | DATA PAD PORTION

MANUFACTURING METHOD OF LIQUID CRYSTAL DISPLAY DEVICE

This application claims priority of Korean application no. 2003-21139, filed Apr. 3, 2003, the entire contents of which are hereby incorporated by reference.

BACKGROUND OF THE INVENTION

1. Field of the Invention

The invention relates to manufacturing a thin film transistor used as a switching device of a liquid crystal display device, and more particularly, to a method for reducing the number of masks used when manufacturing a thin film transistor.

2. Description of the Conventional Art

Generally, a liquid crystal display (LCD) device displays desired information on a screen by controlling the alignment direction of a liquid crystal aligned by an electric field applied between a pixel electrode formed on a TFT (thin film transistor) array substrate and a common electrode on a color filter. Here, the thin film transistor is mainly used as a switching device for applying a voltage to the pixel electrode existing on the TFT array substrate.

The number of masks used for manufacturing the LCD device directly affects the number of process steps. Decreasing the number of process steps increases productivity and yield. Accordingly, one tries to reduce the number of masks used in manufacturing the thin film transistor.

The related art methods for manufacturing TFTs utilize a 5-mask or 4-mask process.

A manufacturing process of a TFT of an LCD device using a related art 5-mask will be explained with reference to FIGS. 1A to 1E.

Figure 1A:
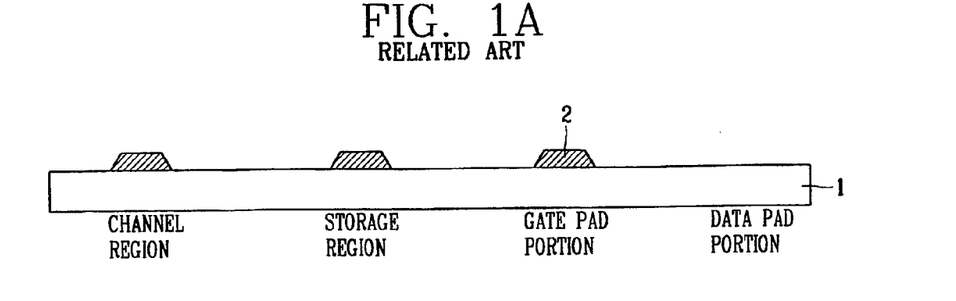
FIGS. 1A to 1E are views showing manufacturing processes of a thin film transistor of an LCD device using a 5-mask process in accordance with the related art.

FIG. 1A shows a gate electrode material being formed on a substrate 1. The gate electrode material is a metal material, and is formed by sputtering.

The metal layer for forming the gate line also serves as a storage line for maintaining the voltage at a TFT for a predetermined time, and it also serves as a gate pattern of a gate pad portion.

After forming the gate metal layer, photoresist (not shown) is deposited on the metal layer, and a photolithography process is performed using a first mask (not shown), thereby selectively forming a gate line, a storage region line, and a gate pattern 2 in the gate pad region on the substrate 1.

Figure 1B:
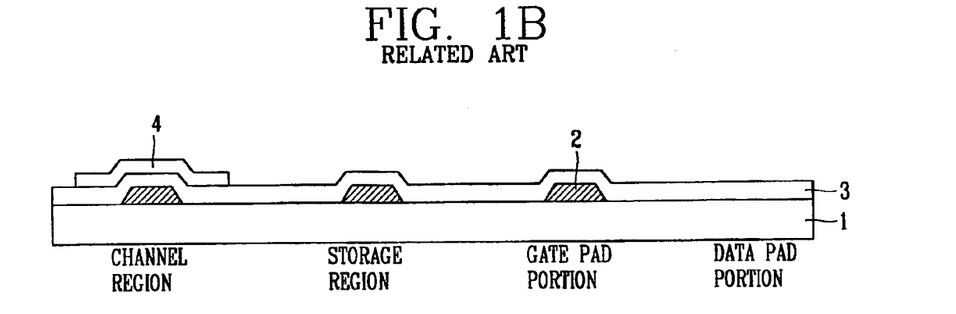

FIG. 1B shows a gate insulating layer 3, an active layer of semiconductor, and a high-concentration impurity layer that are sequentially formed on the resulting material. Then, photolithography is performed using a second mask (not shown) to thus selectively etch so that an active region 4 forms in the channel region. Here, the active region 4 is formed by stacking an amorphous silicon (a-Si) and an ohmic contact layer, and a high-concentration of impurity is doped into the semiconductor layer.

The gate insulating layer and the active layer are generally deposited using a plasma enhanced chemical vapor deposition (PECVD) method.

Figure 1C:
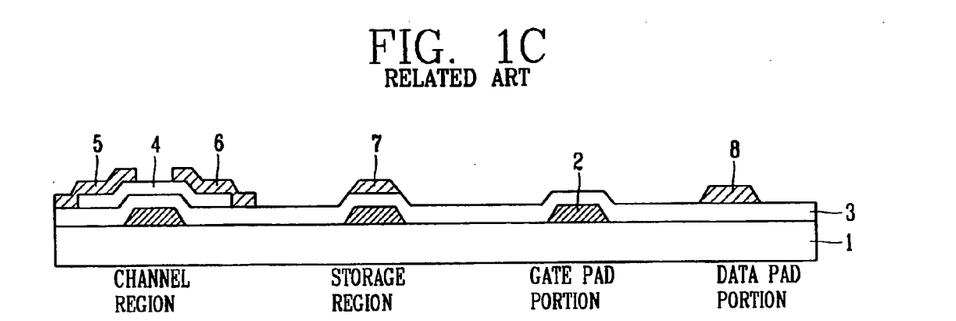

FIG. 1C shows source/drain electrode material that are formed on the resulting material. Then, photolithography is performed using a third mask (not shown) to thus selectively etch so that the source/drain material can be separated from each other at both sides of the active region 4 at the channel region. Also, the source/drain material can be applied as one electrode 7 of a capacitor on the gate insulating layer 3 at the storage region, and the source/drain material can also be applied as a data electrode 8 on the gate insulating layer 3 of a data pad portion.

Figure 1D:
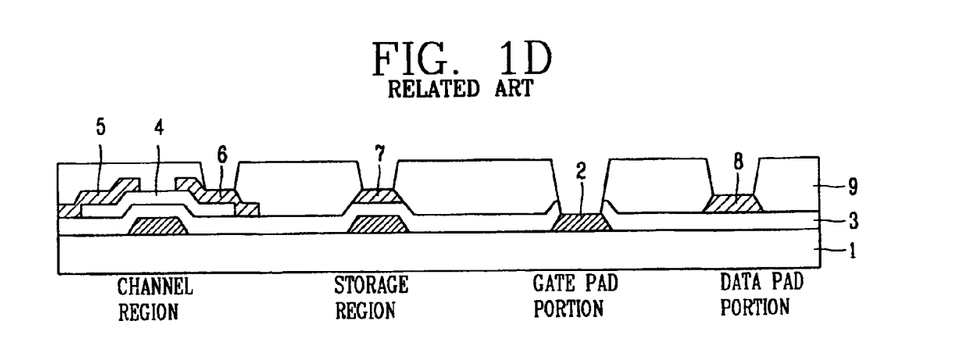

FIG. 1D shows a passivation layer 9 being formed on the resulting material. Then, a contact hole is formed using a fourth mask (not shown) so that the drain region 6 of the channel region, the electrode 7 of the storage region, the gate pattern 2 of the gate pad portion, and the data electrode 8 of the data pad portion can be exposed.

Figure 1E:
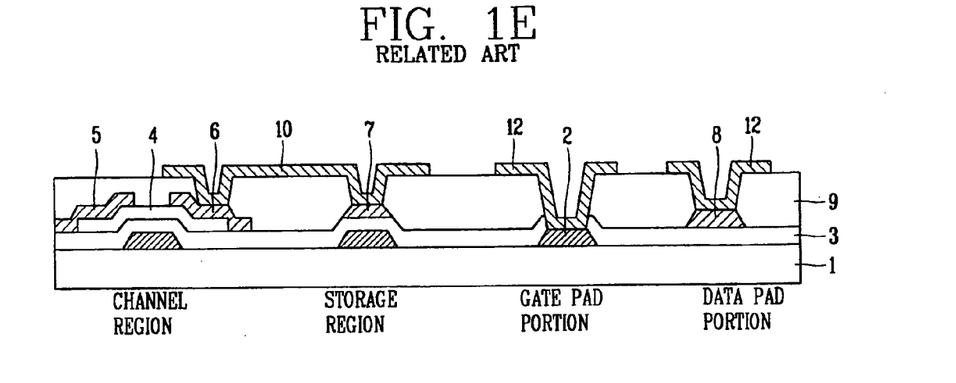

FIG. 1E shows an electrode material being formed on the resulting material. Then, photolithography performed by a fifth mask (not shown) forms a pixel electrode 10 connecting the drain region 6 of the channel region and the electrode 7 of the storage region. At this time, a gate line and a data line are simultaneously formed on the gate pad portion and the data pad portion.

The aforementioned method for manufacturing an LCD device by using a 5-mask process limits the possibilities to reduce manufacturing cost and to simplify processes due to the performance of multiple photolithographic steps.

In order to solve this problem, a related art LCD device manufacturing method using a 4-mask process was proposed.

A manufacturing process for an LCD device using a 4-mask process will be explained with reference to FIGS. 2A to 2G.

Figure 2A:
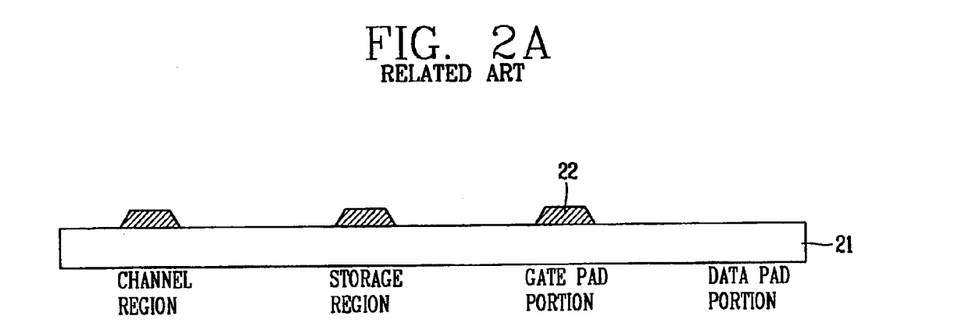
FIGS. 2A to 2H are views showing manufacturing processes of the TFT of an LCD device using a 4-mask process in accordance with the conventional art.

FIG. 2A shows a gate electrode material that is formed on a glass substrate 21. Then, a photolithography process using a first mask (not shown) is performed to thereby selectively form a gate line, a line of the storage region, and an electrode pattern 22 on the substrate 21.

Figure 2B:
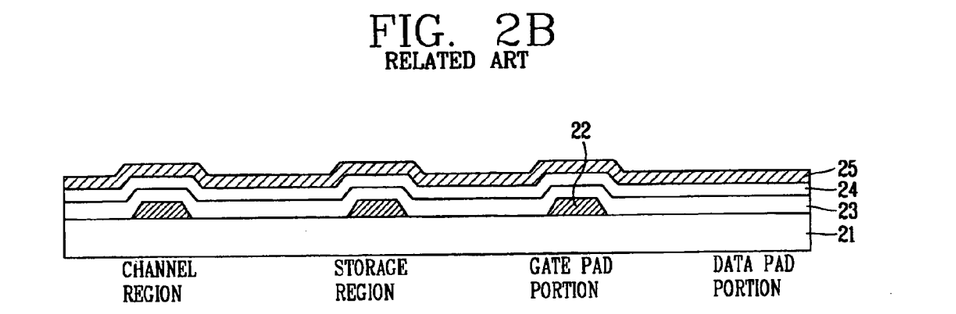

FIG. 2B shows a gate insulating layer 23, an active layer 24, and a conductive layer 25 of a metal that are sequentially formed on the resulting material. Here, the active layer 24 is a stacked layer of a semiconductor layer and a high-concentration impurity layer.

Figure 2C:
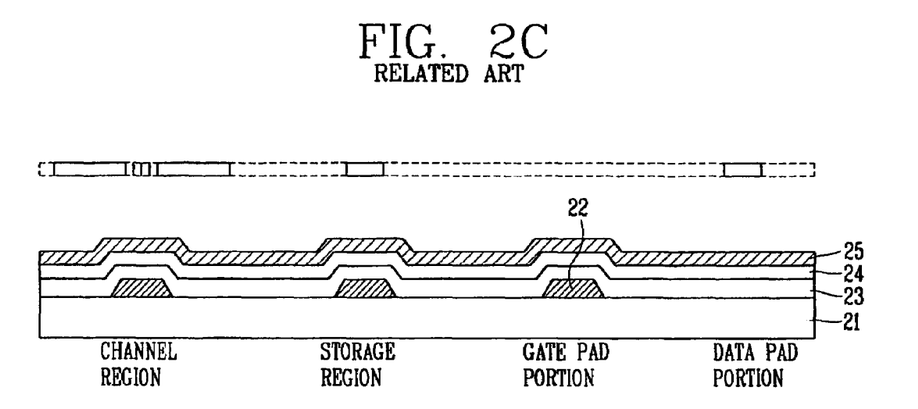

In FIG. 2C, a photoresist layer (not shown) is formed on the conductive layer 25. Then, a photolithographic step using a second mask (not shown) patterns the photoresist layer 40 remaining on the channel region, the storage region, and a data pad portion. A stepped photoresist pattern forms on the conductive layer 25 at the channel region by applying a diffraction exposure to the photoresist layer 40. A source/drain electrode and a channel are formed by using the stepped photoresist pattern as a mask.

Figure 2D:
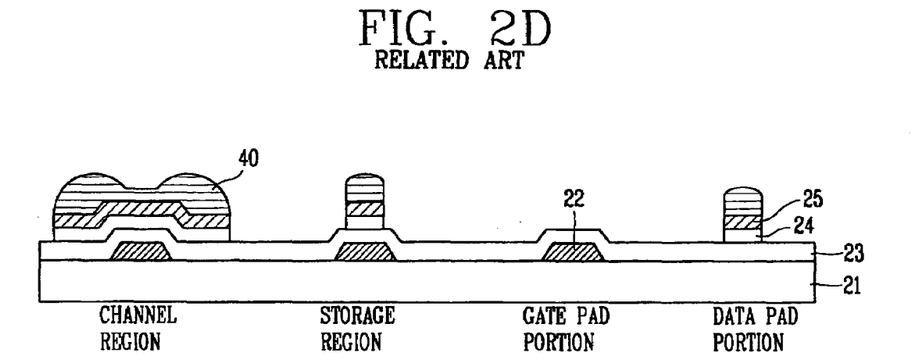

FIG. 2D shows that the conductive layer and the active layer of regions where the photoresist pattern is not present are etched and removed by using the photoresist layer 40 pattern as a mask.

Figure 2E:
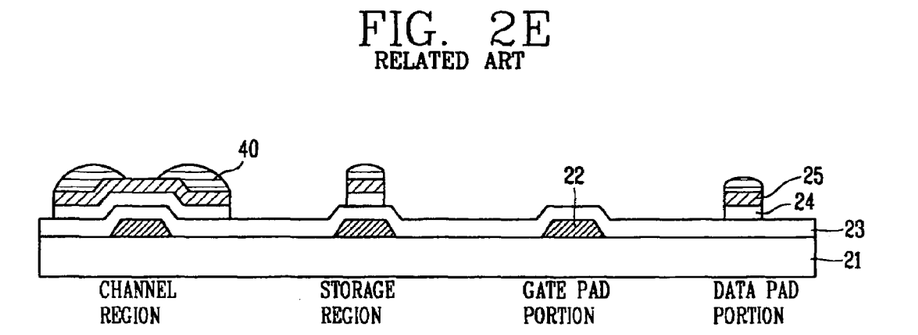

FIG. 2E shows the diffraction-exposed photoresist pattern being partially removed by an ashing process, and the conductive layer above the channel region is exposed.

Figure 2F:
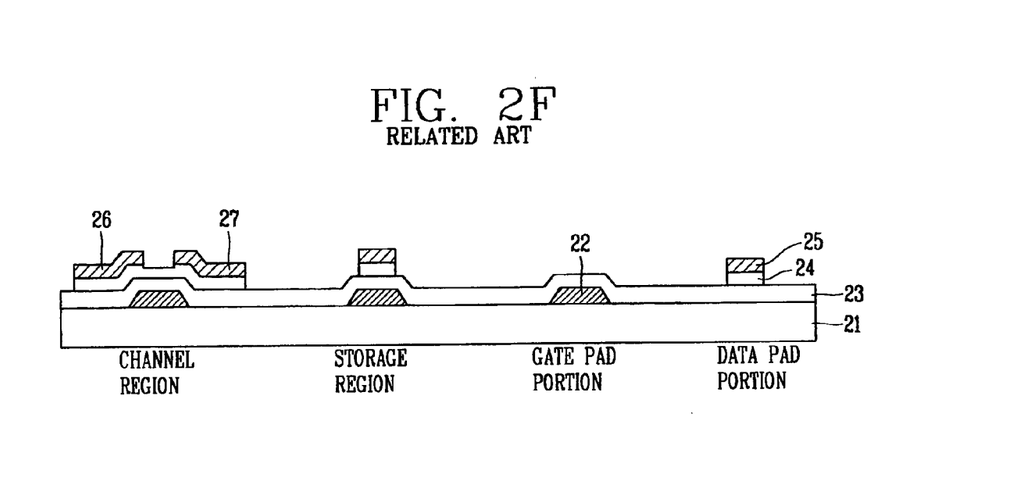

Thereafter, the photoresist layer 40 pattern is selectively removed to thus etch the exposed electrode layer 25 above the channel region. Next, the active layer 24 is etched to a predetermined thickness to form source/drain electrodes 26 and 27 separated from each other at both sides on the active layer 24. Then, as shown in FIG. 2F, the remaining photoresist layer 40 pattern is removed.

Figure 2G:
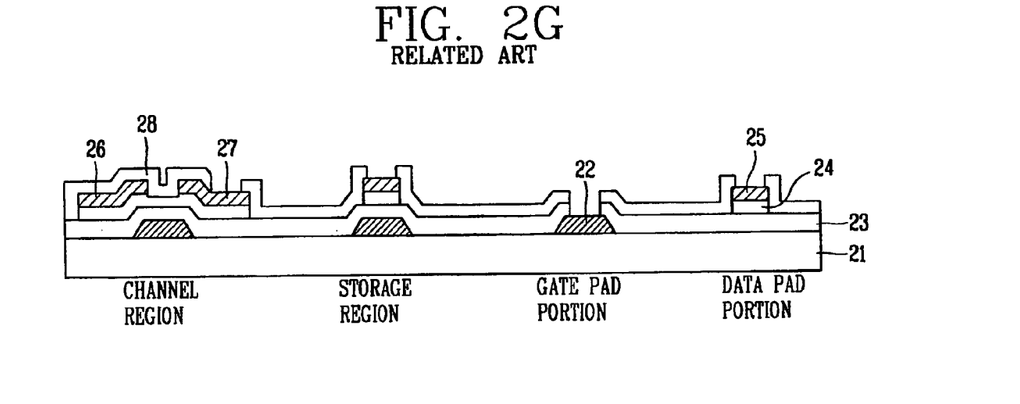

FIG. 2G shows a passivation layer 28 that is formed on the entire resulting material. Then, a photolithography step is performed using a third mask (not shown) to selectively etch so that the drain electrode 27 of the channel region, the electrode layer 25 of the storage region, the gate pattern 22 of the gate pad portion, and the electrode layer 25 of the data pad portion can be exposed.

Figure 2H:
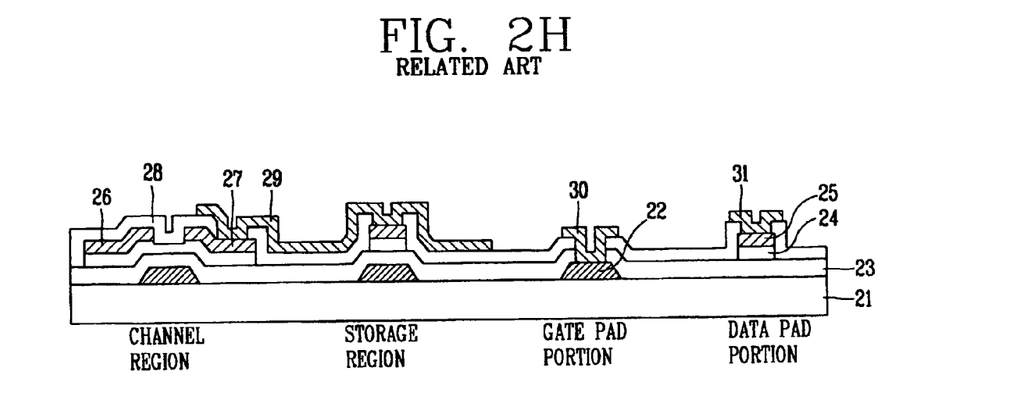

FIG. 2H shows an electrode material that is formed on the resulting material. Then, a photolithography process is performed using a fourth mask (not shown) to selectively etch so that a pixel electrode 29 connecting the drain region 27 of the channel region and the electrode layer 25 of the storage region can be formed. Also, a line 30 connected to the gate pattern 22 of the gate pad portion and a line 31 connected to the electrode layer 25 of the data pad portion can be simultaneously formed during this step.

In this related art manufacturing method of an LCD device using the 4-mask step photolithographic process, the manufacturing cost can be reduced and processes can be simplified compared to the manufacturing method of an LCD device using a 5-mask step photolithographic process.

That is, minimizing the number of masks contributes to reducing the manufacturing cost and to simplifying the overall process.

However, efforts to reduce the number of masks used in manufacturing LCD devices are being continued. The invention is therefore directed at developing an LCD manufacturing method in which the number of masks is minimized when compared to the related art.

SUMMARY OF THE INVENTION

Therefore, an object of the invention is to provide a manufacturing method of an LCD device capable reducing the number of mask processes below the 5-mask or 4-mask processes of the conventional art. This simplified process can thereby reduce manufacturing cost and enhance yield.

The invention, in part, pertains a manufacturing method of semiconductor or liquid crystal display device that uses a 3-mask process which includes forming a gate electrode over a substrate, consecutively forming a gate insulating layer and an active layer over the gate electrode, depositing a photoresist over the active layer and performing a photolithography process to form a first photoresist pattern, and then removing the active layer formed at a source/drain region, ashing the first photoresist pattern to expose a part of an active region, forming a source/drain electrode at the source/drain region, forming a passivation layer on the substrate including the source/drain electrode, forming a second photoresist pattern that exposes a pixel region on the passivation layer, forming a pixel region by using the second photoresist pattern as a mask, side-etching a part of the passivation layer thus to expose a part of the drain electrode, forming a pixel electrode material over the second photoresist pattern and the pixel region, and simultaneously removing the second photoresist pattern and the pixel electrode material formed thereon to form a pixel electrode.

In the invention, the step of removing the active layer formed at the source/drain region can include depositing a photoresist over the active layer, applying a mask to the photoresist, exposing, developing, and thereby forming a photoresist pattern where the source/drain region is defined, and applying the photoresist pattern as a mask. The step for forming the active layer can include forming a semiconductor layer over the gate insulating layer, and forming a high-concentration impurity layer over the semiconductor layer. The step of forming the source/drain electrode at the source/drain region can include forming a conductive layer over the photoresist pattern where the source/drain region is defined, simultaneously removing the photoresist pattern and the conductive layer formed thereon by a lift-off process, and removing the high-concentrated impurity layer formed above the channel region. Also, the photoresist pattern can be formed above the channel region and the pixel region. In the step for side-etching a part of the passivation layer thus to expose a part of the drain electrode, the passivation layer can be side-etched by using fluorine-containing gas.

In the Invention, the step for side-etching a part of the passivation layer to expose a part of the drain electrode can further comprise removing a part of the active layer remaining at a side surface of the source electrode by side-etching, and the active layer can be removed by using chlorine ion-containing gas. The pixel electrode material and the photoresist pattern formed thereunder can be simultaneously removed by a lift-off process. In the step for forming a pixel electrode material on the photoresist pattern and the pixel region, the pixel electrode material can be formed over a part of the drain electrode. The step for ashing the first photoresist pattern thus to expose a part of an active region can further include exposing a part of a high-concentrated impurity layer of the active region by oxidizing a part of the photoresist with oxygen ion-containing plasma gas.

The step for applying a second photoresist pattern as a mask thus to form a pixel region can include sequentially removing the passivation layer and the active layer formed at the pixel region. Also, the step for applying a second photoresist pattern as a mask thus to form a pixel region can further include removing the gate insulating layer formed at the pixel region.

The invention, in part, pertains to a method for manufacturing a semiconductor device that includes providing a substrate, forming a photoresist layer over the substrate, forming a conductive layer over the photoresist layer, and simultaneously removing the photoresist layer and the conductive layer. The photoresist can be a positive photoresist or a negative photoresist. The conductive layer can be formed from a metal or metal oxide. Also, the step of simultaneously removing the photoresist layer and the conductive layer is performed by etching.

The foregoing and other objects, features, aspects and advantages of the invention will become more apparent from the following detailed description of the invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Advantages of the invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Reference will now be made in detail to the preferred embodiments of the invention, examples of which are illustrated in the accompanying drawings.

A manufacturing process of an LCD device according to an embodiment of the invention will be explained with reference to FIGS. 3A to 3J.

Figure 3A:
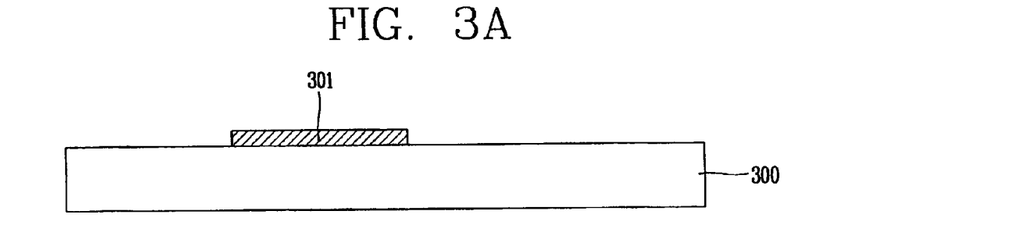
FIGS. 3A to 3J are views showing manufacturing processes of a TFT of an LCD device using a 3-mask process according to the invention.

FIG. 3A shows a metal layer forming a gate electrode that is deposited on a substrate 300 by a sputtering method. Sputtering is a method to deposit a target material, which is formed by colliding a target with accelerated and ionized particles. In the sputtering process, high-energy particles strike a solid slab of high-purity target material and physically dislodge atoms. These sputtered atoms migrate through a vacuum and eventually deposit on a substrate.

A photoresist is deposited on the metal layer to form a gate electrode. Then, a gate electrode 301 is formed by a photolithography process by using the photoresist as a first mask.

Figure 3B:
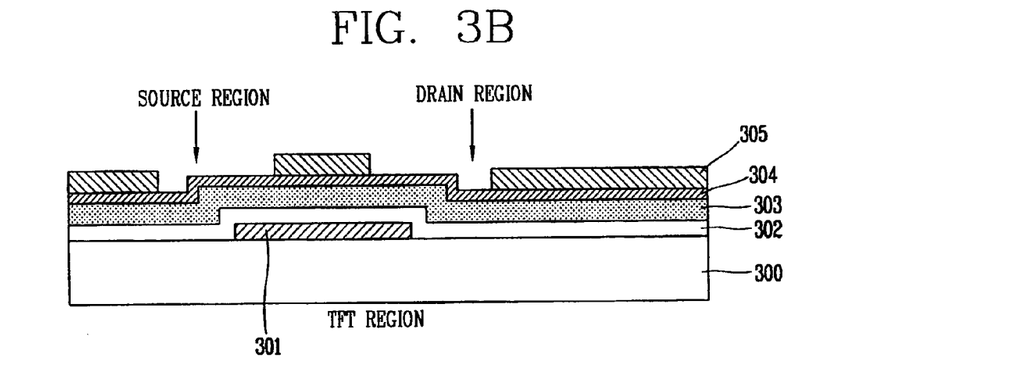

Then, as shown in FIG. 3B, a gate insulating layer 302, an amorphous silicon layer 303, and a high-concentration impurity layer 304 are sequentially formed on the gate electrode 301. Next, a photoresist 305 is deposited on the resulting material, exposed and developed, thereby defining a source/drain region.

The source/drain region is defined in the invention by removing a photoresist layer at a source/drain region and leaving photoresist over the rest of the structure.

The photoresist can be either a positive photoresist or a negative photoresist. A negative photoresist can typically be based upon polyisoprene chemistry. Positive photoresists are frequently made from phenyl-formaldehyde (novolak) resins. Deep UV resists can be phenyl-formaldehyde resin with a DNQ (diazonanapthoquinone) sensitizer. Resists can also be made using polyhydroxystyrene chemistry.

Figure 3C:
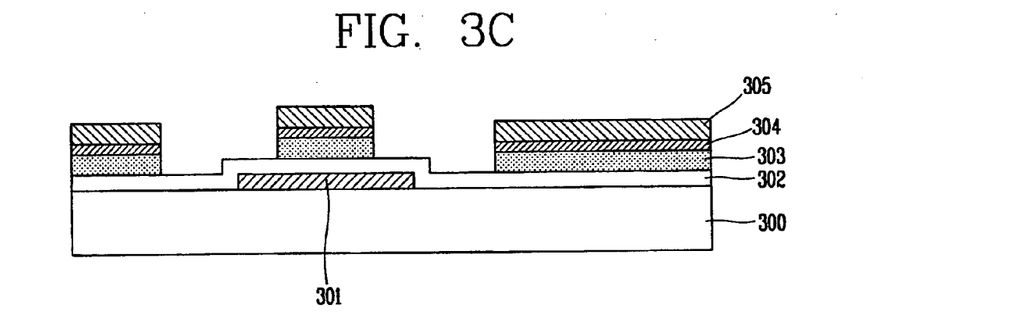

FIG. 3C shows the high-concentration impurity layer 304 not covered by photoresist that is exposed to the outside in accordance with the removal of the photoresist layer over the source/drain region. Etching removes the high-concentration impurity layer 304 and the amorphous silicon layer 303 over the source/drain region.

After etching, the photoresist 305 remains at regions including a channel region, except over the source/drain region. In order to form the source/drain electrode connected to the channel region, the photoresist formed at the edge of the channel region has to be partially removed.

Figure 3D:
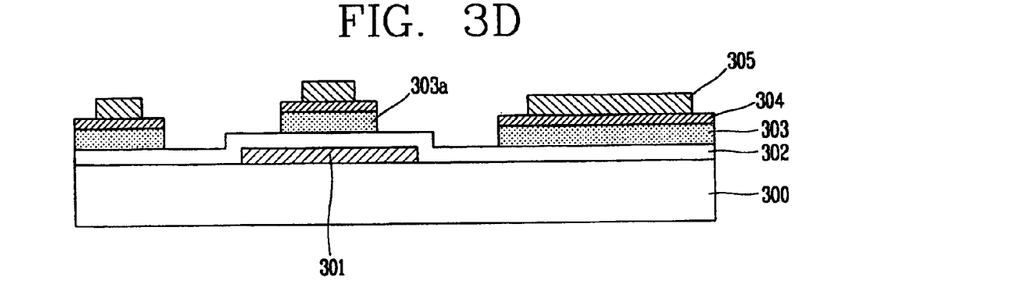

FIG. 3D shows that a part of the photoresist 305 is removed by being oxidized under an oxygen atmosphere. As the result, the entire volume of the photoresist 305 is decreased, and a the edge of the channel region is partially exposed.

The process for oxidizing the photoresist 305 under the oxygen atmosphere is called an ashing process. The ashing process is a process for removing materials reacted to an oxidation by injecting an oxygen-containing gas into a chamber. The oxygen-containing gas can be an oxygen ion-containing plasma gas. The ashing time, ashing temperature, and other conditions are controlled to partially remove the photoresist 305 to thereby expose a portion of the edge of the channel region.

Next, a conductive layer 306 is formed over the resulting material of FIG. 3D by using a sputtering method.

Figure 3E:
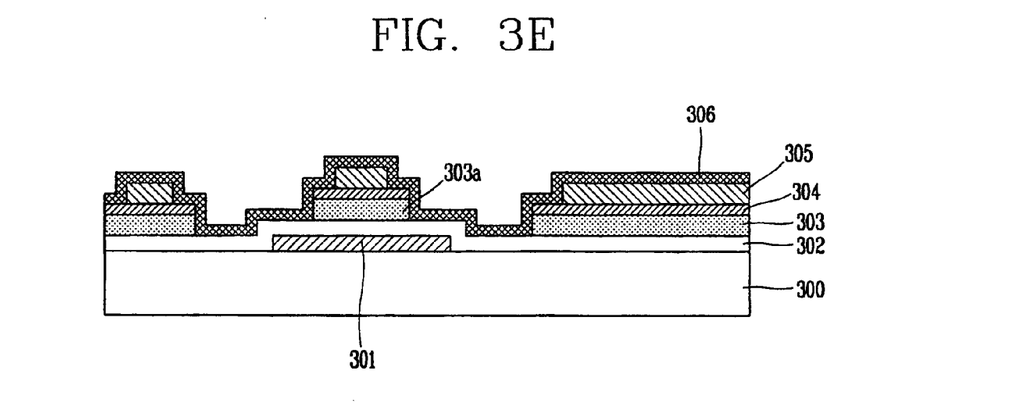

FIG. 3E shows the conductive layer 306 formed over the device structure, including photoresist 305 remaining after the ashing process.

Next, a lift-off process is applied to simultaneously remove the contiguous photoresist 305 and the conductive layer 306.

That is, when the lift-off process is applied to the resulting material of FIG. 3E, the photoresist 305 and the conductive layer 306 formed thereon (which form a bilayer) are simultaneously removed, and only the source/drain electrode pattern remains. The invention is not restricted to a photoresist/metal combination, but additional layers in different arrangements can also be removed by etching the interior photoresist structure.

The lift-off process includes a metal layer (which can be Au, Ag, Al, Cu, In, ITO or IZO) being formed over the photoresist pattern. Then, the photoresist is removed by a strip process that simultaneously removes the portions of the conductive layer over the photoresist.

Figure 3F:
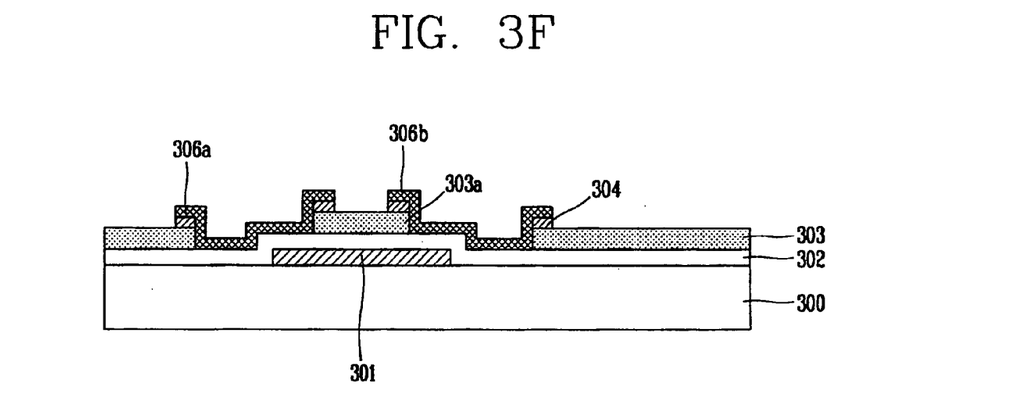

FIG. 3F shows a source electrode 306a and a drain electrode 306b formed by simultaneously removing the photoresist 305 and the conductive layer 306 formed thereon by the lift off process and then by removing the exposed high-concentration impurity layer.

Figure 3G:
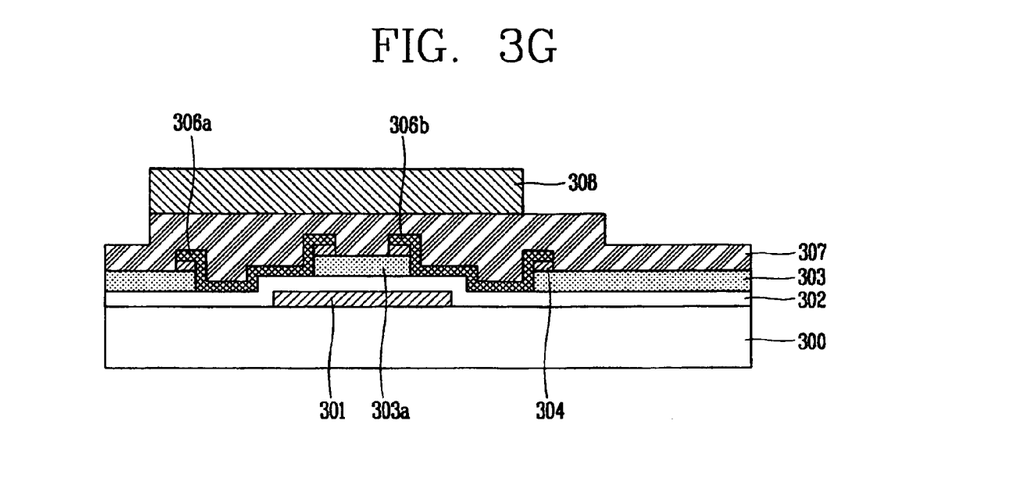

As shown in FIG. 3G, a passivation layer 307 is formed on the source/drain electrode formed by the lift off process. A photoresist is deposited on the passivation layer, and then the photoresist layer is patterned so that the photoresist can remain over the active region by using a third mask. As a result, the photoresist pattern 308 is formed above a region that a thin film transistor is formed.

Next, an etching process uses the photoresist 308 of FIG. 3G as a mask, thereby removing the semiconductor layer 303, and the passivation layer 307 existing on a pixel region. In order to improve an aperture ratio, the gate insulating layer 302 formed on the pixel region is further etched thus to be removed. As a result, the substrate existing at the pixel region is exposed. However, the gate insulating layer is generally a transparent inorganic layer, and it is therefore possible not to remove the gate insulating layer.

Next, a pixel electrode material (such as ITO or IZO) is deposited. The pixel electrode material has electrically connects to the drain electrode 306b. The passivation layer 307 is side-etched a using fluorine-containing gas so as to expose a part of the drain electrode 306b. The fluorine-containing gas can be a fluorine ion-containing plasma gas. When the drain electrode 306b is to be electrically connected to the pixel electrode, it is sufficient to expose the drain electrode within a range of approximately 1 μm. Other ranges can be used, and ranges of from 0.5-1.5 μm can be used.

Figure 3H:
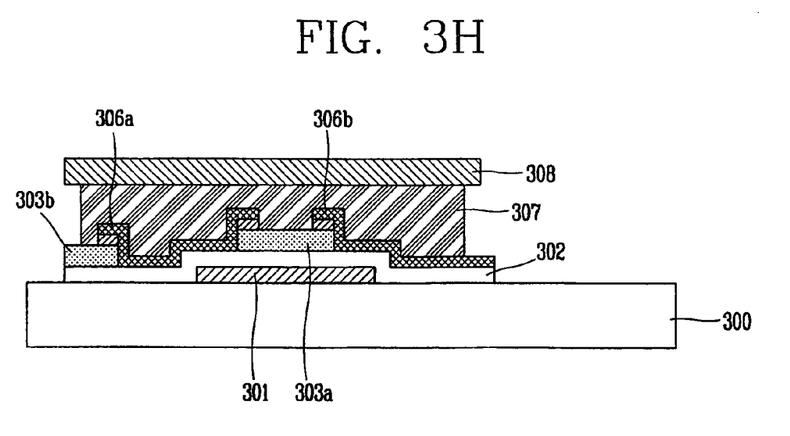

FIG. 3H shows the passivation layer 307 that has undergone the side etching by a fluorine-based gas, and an aspect of part of the drain electrode is exposed.

FIG. 3H also shows an active layer 303b that remains at one side of the source electrode. Due to the active layer 303b remaining at one side of the source electrode, the data line and the pixel electrode are too nearly adjacent to each other, thereby causing cross-talk from interactive interference when information is inputted.

Therefore, in the invention, the active layer remaining at one side of the source electrode that may cause the cross talk is side-etched and removed using chlorine-based gas.

Figure 3I:
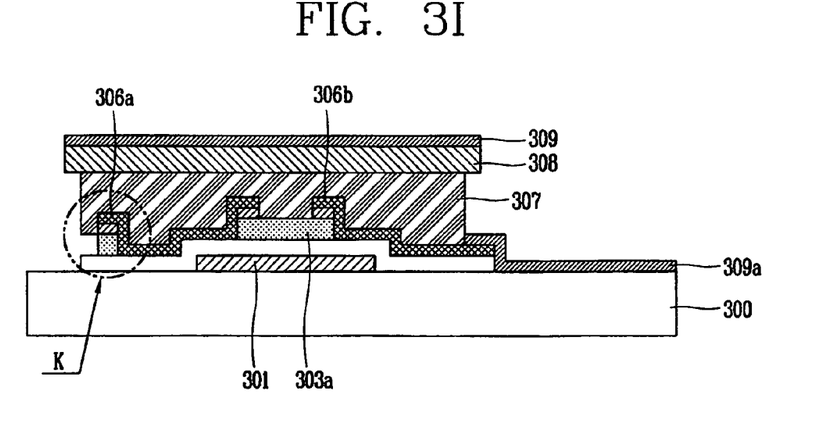

In order to prevent the cross talk between the source electrode and the pixel electrode, the active layer remaining at one side of the source electrode is etched to a range of approximately 2-4 μm, preferably about 3 μm. In FIG. 3I, the k region shows the active layer that has undergone the side etching.

In the inventive process, side etching the passivation layer to expose a part of the drain electrode and the side etching the active layer to prevent cross talk between the source electrode and the pixel electrode, can be performed simultaneously or at different times.

FIG. 3I shows that a pixel electrode material 309 is deposited on the resulting material after performing the side etching of the passivation layer. The pixel electrode material 309 is deposited over the photoresist pattern 308 above a region where a TFT is to be formed and also over the pixel region. Since a part of the pixel electrode material is also formed on the drain electrode exposed by the side etching, the drain electrode and the pixel electrode are electrically connected to each other.

As the pixel electrode material, indium tin oxide (ITO) or indium zinc oxide (IZO) having an excellent conductivity and optical transmissivity can be used.

Next, the photoresist pattern above the region where a TFT is to be formed and the pixel electrode material on the photoresist pattern are simultaneously removed by the lift off process. As the result, an LCD device including a pixel electrode 309a connected to the drain electrode is completed.

Figure 3J:
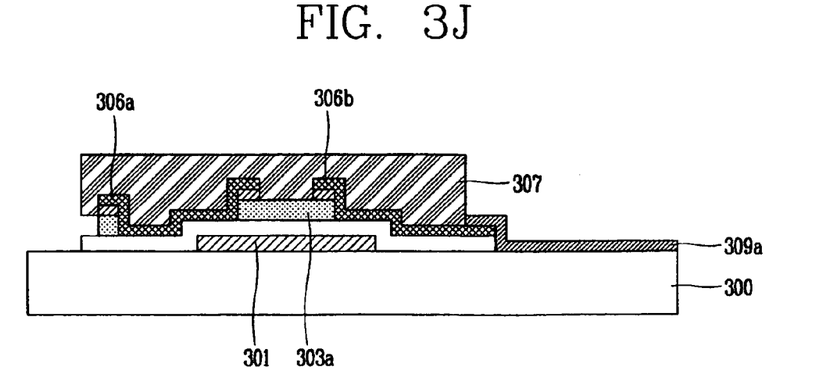

FIG. 3J shows a TFT that has been completed by removing both the photoresist pattern above a region where a TFT is to be formed and the pixel electrode material on the photoresist pattern by the lift off process.

In the invention, the first mask is used to form the gate pattern at the time of forming the gate electrode pattern, the second mask is used to pattern the source/drain region, and the third mask is used to form the pixel region, thereby manufacturing the TFT. Accordingly, the number of masks for manufacturing the TFT is reduced to thus simplify the process. Also, the slit mask used in the conventional 4-mask process is not used, thus greatly reducing mask cost.

As the invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for manufacturing a liquid crystal display device comprising:
   forming a gate electrode over a substrate;
   consecutively forming a gate insulating layer and an active layer over the gate electrode;
   depositing a photoresist over the active layer and performing a photolithography process to form a first photoresist pattern, and then removing the active layer formed at a source/drain region;
   ashing the first photoresist pattern to expose a part of an active region;
   forming a source/drain electrode at the source/drain region;
   forming a passivation layer on the substrate including the source/drain electrode;
   forming a second photoresist pattern that exposes a pixel region on the passivation layer;
   forming a pixel region by using the second photoresist pattern as a mask;
   side-etching a part of the passivation layer thus to expose a part of the drain electrode;
   forming a pixel electrode material over the second photoresist pattern and the pixel region; and
   simultaneously removing the second photoresist pattern and the pixel electrode material formed thereon to form a pixel electrode.

2. The method of claim 1, wherein the step of removing the active layer formed at the source/drain region comprises:
   depositing a photoresist over the active layer;
   applying a mask to the photoresist, exposing, developing, and thereby forming a photoresist pattern where the source/drain region is defined; and
   applying the photoresist pattern as a mask.

3. The method of claim 1, wherein the step for forming the active layer comprises:
   forming a semiconductor layer over the gate insulating layer; and
   forming a high-concentration impurity layer over the semiconductor layer.

4. The method of claim 1, wherein the step of forming the source/drain electrode at the source/drain region comprises:
   forming a conductive layer over the photoresist pattern where the source/drain region is defined;
   simultaneously removing the photoresist pattern and the conductive layer formed thereon by a lift-off process; and
   removing the high-concentrated impurity layer formed above the channel region.

5. The method of claim 4, wherein the photoresist pattern is formed above the channel region and the pixel region.

6. The method of claim 1, wherein in the step for side-etching a part of the passivation layer thus to expose a part of the drain electrode, the passivation layer is side-etched by using fluorine-containing gas.

7. The method of claim 1, wherein the step for side-etching a part of the passivation layer to expose a part of the drain electrode further comprises removing a part of the active layer remaining at a side surface of the source electrode by side-etching.

8. The method of claim 7, wherein the active layer is removed by using chlorine ion-containing gas.

9. The method of claim 1, wherein the pixel electrode material and the photoresist pattern formed thereunder are simultaneously removed by a lift-off process.

10. The method of claim 1, wherein in the step for forming a pixel electrode material on the photoresist pattern and the pixel region, the pixel electrode material is formed over a part of the drain electrode.

11. The method of claim 1, wherein the step for ashing the first photoresist pattern thus to expose a part of an active region further comprises exposing a part of a high-concentrated impurity layer of the active region by oxidizing a part of the photoresist with oxygen ion-containing plasma gas.

12. The method of claim 1, wherein the step for applying a second photoresist pattern as a mask thus to form a pixel region comprises sequentially removing the passivation layer and the active layer formed at the pixel region.

13. The method of claim 12, wherein the step for applying a second photoresist pattern as a mask thus to form a pixel region further comprises removing the gate insulating layer formed at the pixel region.

14. A method for manufacturing a semiconductor device comprising:
   providing a substrate;
   forming a photoresist layer over the substrate;
   forming a conductive layer over the photoresist layer;
   simultaneously removing the photoresist layer and the conductive layer, said conductive layer being removed only at portions corresponding to the photoresist layer to form a source/drain electrode;

forming a passivation layer on the substrate including the source/drain electrode;

forming a second photoresist pattern that exposes a pixel region on the passivation layer;

forming a pixel region by using the second photoresist pattern as a mask;

side-etching a part of the passivation layer thus to expose a part of the drain electrode;

forming a pixel electrode material over the second photoresist pattern and the pixel region; and simultaneously removing the second photoresist pattern and the pixel electrode material formed thereon to form a pixel electrode.

15. The method of claim 14, wherein the photoresist is a positive photoresist or a negative photoresist.

16. The method of claim 14, wherein the conductive layer is formed from a metal or metal oxide.

* * * * *